(12) United States Patent
Ng et al.

(10) Patent No.: US 7,132,823 B2
(45) Date of Patent: Nov. 7, 2006

(54) DESIGN FOR TEST FOR A HIGH SPEED SERIAL INTERFACE

(75) Inventors: Kent W. Ng, Moutain View, CA (US); Jeremy T. Braun, Seattle, WA (US); Gregory G. Williams, Menlo Park, CA (US); Harjit Singh, Redmond, WA (US)

(73) Assignee: Microsoft Corporation, Redmond, WA (US)

( * ) Notice: Subject to any disclaimer, the term of this patent is extended or adjusted under 35 U.S.C. 154(b) by 0 days.

(21) Appl. No.: 11/040,843

(22) Filed: Jan. 21, 2005

(65) Prior Publication Data
US 2006/0164072 A1    Jul. 27, 2006

(51) Int. Cl.
*G01R 31/28* (2006.01)
*G01R 31/26* (2006.01)

(52) U.S. Cl. ..................... 324/158.1; 324/765

(58) Field of Classification Search ............ None
See application file for complete search history.

(56) References Cited

U.S. PATENT DOCUMENTS 5,450,530 A * 9/1995 Snyder et al. ............... 375/220

| | | | |
|---|---|---|---|
| 6,427,216 B1 * | 7/2002 | El-Kik et al. | 714/726 |
| 6,591,369 B1 * | 7/2003 | Edwards et al. | 713/400 |
| 6,601,189 B1 * | 7/2003 | Edwards et al. | 714/30 |
| 6,665,816 B1 * | 12/2003 | Edwards et al. | 714/30 |
| 6,779,145 B1 * | 8/2004 | Edwards et al. | 714/724 |
| 2005/0213761 A1 * | 9/2005 | Walmsley et al. | 380/255 |

OTHER PUBLICATIONS

"PCI Express Base Specification Revision 1.0a", PCI-SIG, Apr. 15, 2003, pp. 1-8, 151-219.
"Serial ATA: High Speed Serialized AT Attachment", Revision 1.0a, APT Technologies, Inc., Dell Computer Corporation, Intel Corporation, Maxtor Corporation, Maxtor Corporation, Seagate Technology, Jan. 7, 2003, pp. 1-6, 129-153.

* cited by examiner

*Primary Examiner*—Jermele Hollington
(74) *Attorney, Agent, or Firm*—Vierra Magen Marcus & DeNiro LLP

(57) ABSTRACT

Detecting a connection between two circuits utilizing a high-speed interface. Interface circuitry internal to a computing device performs an initialization process between two processors automatically to determine the state of the interface connection. Test circuitry retrieves the interface state from the interface circuitry. Neither the configuration process, the interface circuitry or the test circuitry require full functionality of an IC on which they reside in order to operate.

8 Claims, 14 Drawing Sheets

| Public Instruction | Opcode |
|---|---|
| SAMPLE/PRELOAD | 0010 |
| BYPASS | 1111 |
| Private Instruction | Opcode |
| MEM_BIST | 0101 |
| PCIE_BIST | 0110 |
| PCIE_REMO | 0111 |
| TEST_CTRL | 1010 |

Figure 7

| TEST DATA REGISTER | SIZE | INSTRUCTION | CLOCK (MHZ |
|---|---|---|---|
| Boundary Scan (BSR) | 292 | SAMPLE/PRELOAD EXTEST | 100 |
| pcie_remo | 2 | PCIE_REMO | 100 |

Figure 8

DESIGN FOR TEST FOR A HIGH SPEED SERIAL INTERFACE

BACKGROUND OF THE INVENTION

1. Field of the Invention

The present invention is directed to connectivity testing of a high speed interface.

2. Description of the Related Art

An important goal of computing device manufacture testing is determining the cause of a printed circuit board (PCB) malfunction. For example, a PCB may malfunction due to a defective integrated circuit (IC) or defective soldering between the IC and a PCB. This can be a very important distinction when the IC is manufactured by one entity and assembled to a PCB by another. A defective soldering job can fixed relatively quickly at little cost by re-soldering. A PCB with a defective IC can be fixed by replacing the IC. Replacing a defective IC is more costly than re-soldering. A PCB soldering malfunction misdiagnosed as a defective IC will increase the cost of manufacturing. Thus, it is important to distinguish between causes of PCB malfunction during manufacturing testing. In particular, distinguishing between defective ICs and defective soldering allows faster debug and repair rates, provides for removal and damage of fewer good parts, and cheaper manufacturing costs.

PCI-Express is high speed interface for transferring data and information between two or more ICs. PCI-Express utilizes AC-coupling and differential signaling to send and receive information. IEEE 1149.1 describes a common boundary scan technology for performing manufacturing tests on some types of ICs. Boundary scan technology detects and asserts signals and data applied to the extruding pins and/or solder balls an IC. The 1149.1 boundary scan technique is not suitable for testing the AC-coupling and differential signaling utilized in PCI-Express. A new technology, IEEE 1149.6, provides for boundary scan testing of AC-coupled and/or differential buses. Though the IEEE 1149.6 can apply and retrieve signals from IC pins utilizing a high speed interface with AC-coupling and differential signaling, its recent release has resulted in limited utilization.

Due to the lack of PCB manufacturing testing capabilities on high speed serial interfaces such as PCI-Express, the cause of PCB malfunction in computing devices utilizing high speed interfaces cannot be distinguished. It is very important to determine whether a PCB malfunction for a high speed interface is caused by a defective IC or defective soldering between the IC and a PCB.

SUMMARY OF THE INVENTION

The technology herein, roughly described, pertains to determining the existence of a connection between two high-speed interfaces. If a high-speed interface connection is detected, then soldering can be eliminated as a cause of an improperly operating PCB. Interface circuitry may perform an initialization and configuration of the high speed interface between two ICs. In one embodiment, the initialization and configuration process determines the state of the interface connection and is performed automatically. Test circuitry may retrieve the interface state from the interface circuitry. Neither the configuration process, the interface circuitry or the test circuitry require full functionality of an IC on which they reside in order to operate. If the interface state indicates communication between the ICs is established, basic connection details such as proper soldering of each IC to a circuit board can be confirmed.

In one embodiment, a method for determining the state of a high-speed interface may include performing an automated connectivity test for a high-speed interface by interface circuitry. The connectivity test can be performed during initialization of the high-speed interface. After the connectivity test is performed, connectivity test results are stored on the interface circuitry. The test results are then retrieved from the interface circuitry using test circuitry.

In one embodiment, a system for determining the state of an interface includes a high-speed interface, interface circuitry coupled to the high-speed interface, a state detector, a storage device and test circuitry. The interface circuitry can include the state detector and storage device. The state detector can be configured to detect a state of the high-speed interface and store the state in the storage device. The test circuitry is connectively coupled to the interface circuitry and includes a storage retrieval device. The storage retrieval device retrieves the state of the high-speed interface stored in the storage device of the interface circuitry.

In one embodiment, an integrated circuit can include interface circuitry and test circuitry. The interface circuitry has access to a high-speed communication port of the integrated circuit and can include an interface configuration device. The interface configuration device is able to automatically determine and store a connectivity state associated with the high-speed communication port. The test circuitry is able to retrieve the connectivity state from the interface circuitry.

In one embodiment, a system for determining the state of an interface includes interface circuitry, data registers and test instruction registers. The interface circuitry is able to determine and store interface state information associated with a high-speed interface. The data registers are able to receive interface state information from the interface circuitry. The test instruction registers are configured to enable observation of the data registers in response to receiving a retrieval instruction.

BRIEF DESCRIPTION OF THE DRAWINGS

FIG. 7 illustrates a table containing instruction opcodes.

FIG. 8 illustrates a table containing test data register information.

DETAILED DESCRIPTION

In one embodiment, the system and method of the present invention determines the existence of a connection between two high-speed interfaces. Determining the connectivity of a high speed interface between two ICs helps distinguish between causes of PCB malfunction during manufacturing testing. Interface circuitry may perform an initialization and configuration of the high speed interface between two ICs. In one embodiment, the initialization and configuration process determines the state of the interface connection and is performed automatically. Test circuitry may retrieve the interface state from the interface circuitry. Neither the configuration process, the interface circuitry or the test circuitry require full functionality of an IC on which they reside in order to operate. If the interface state indicates communication between the two ICs is established, basic connection details such as proper soldering of each IC to a PCB can be confirmed.

Figure 1:
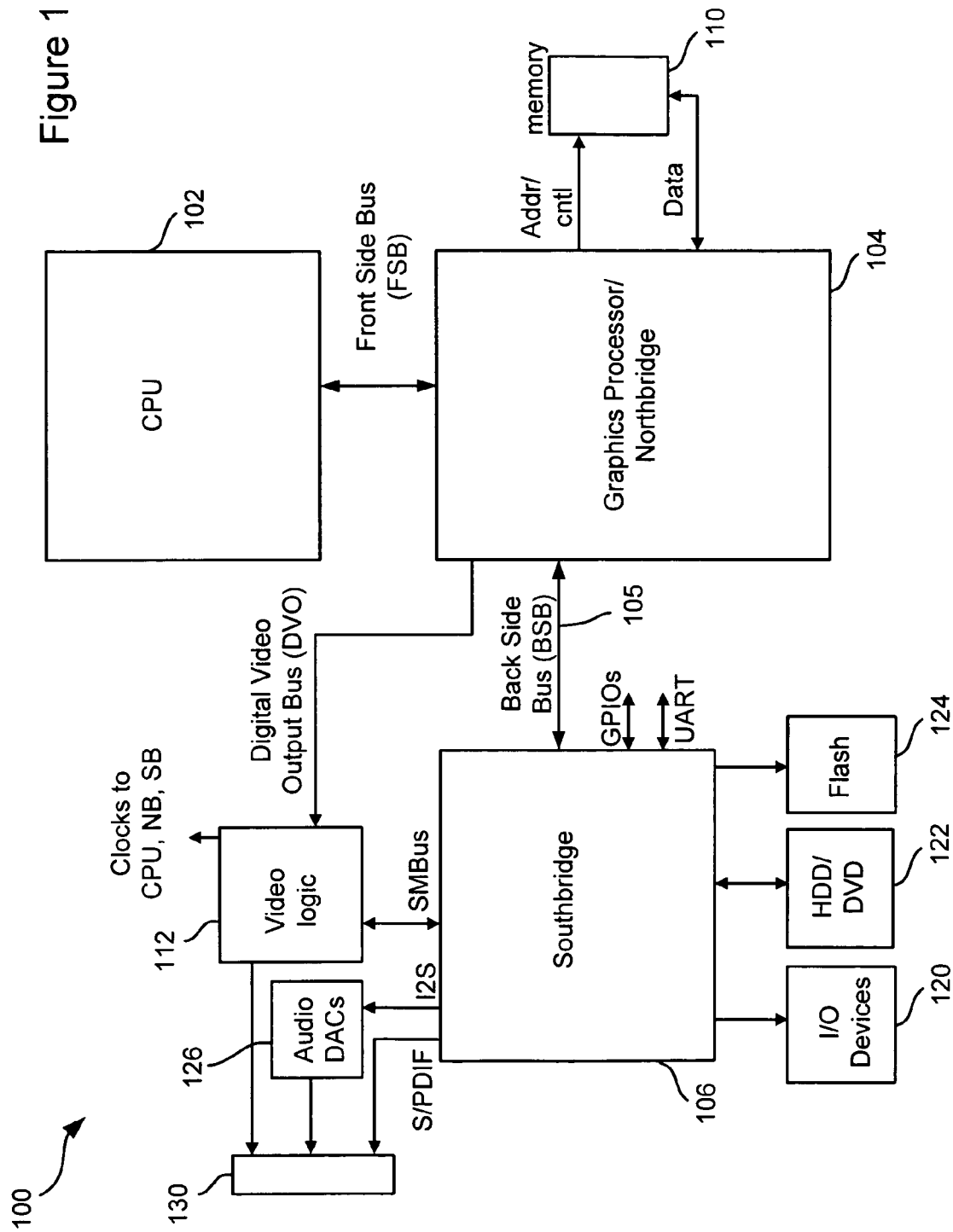
FIG. 1 illustrates one embodiment of a computing device.

FIG. 1 illustrates one embodiment of a computing device suitable for use with the present invention. One example of such a computing device can be a game device for providing multimedia experiences and playing video games that includes audio and video. Audio and video data tends to be deterministic, streaming and digital until reaching a digital to analog interface. Within computing device 100, audio and video processing circuits process the data internally as digital data, but output the data on analog signals.

Computing device 100 includes central processing unit (CPU) 102, graphics processor/Northbridge 104, memory 110, video logic 112, audio digital-to-analog converters 126, Southbridge 106, input/output devices 120, HDD and DVD devices 122 and flash 124. Northbridge 104 communicates with memory 110 via address control lines (Addr/cntl) and data lines (Data). In one embodiment, Northbridge 104 provides processing functions, memory functions, and serves as an intermediary between CPU 102 and Southbridge 106. Northbridge 104 communicates with Southbridge 106 via a Backside Bus (BSB). In one embodiment, backside bus 105 is implemented as a PCI Express high-speed serial interface. Southbridge 106 performs various I/O functions, signal processing and other functions. Southbridge 106 is in communication with I/O devices 120, hard disc drive and DVD drives 122, and flash memory 124. Northbridge 104 communicates with video logic 112 via a Digital Video Output Bus (DVO).

Northbridge 104 communicates with Southbridge 106 via a Backside Bus (BSB). Southbridge 106 performs various I/O functions, audio processing and testing functions. Southbridge 106 is in communication with I/O devices 120, hard disc drive and DVD drives 122, and flash memory 124. System 100 also includes video logic 112. Northbridge 104 communicates with video logic 112 via a Digital Video Output Bus (DVO). Video logic 112 also includes clock generation circuits which provide clocks to CPU 102, Northbridge 104 and Southbridge 106.

As discussed above, Southbridge 106 provides various audio processing. Southbridge communicates with digital to analog converters 126 via an I2S Bus. I2S is a standard digital audio chip-to-chip unidirectional interface. In its basic form, it consists of a sample clock (SCLK), a master clock (MCLK), a left/right indicator (LRSEL), and a serial data line. An interface 130 is included for connecting system 100 to components outside the system. Southbridge 106 is connected to interface 130 directly. In addition, digital analog converters 126 and video logic 112 are also connected to interface 430.

Figure 2:
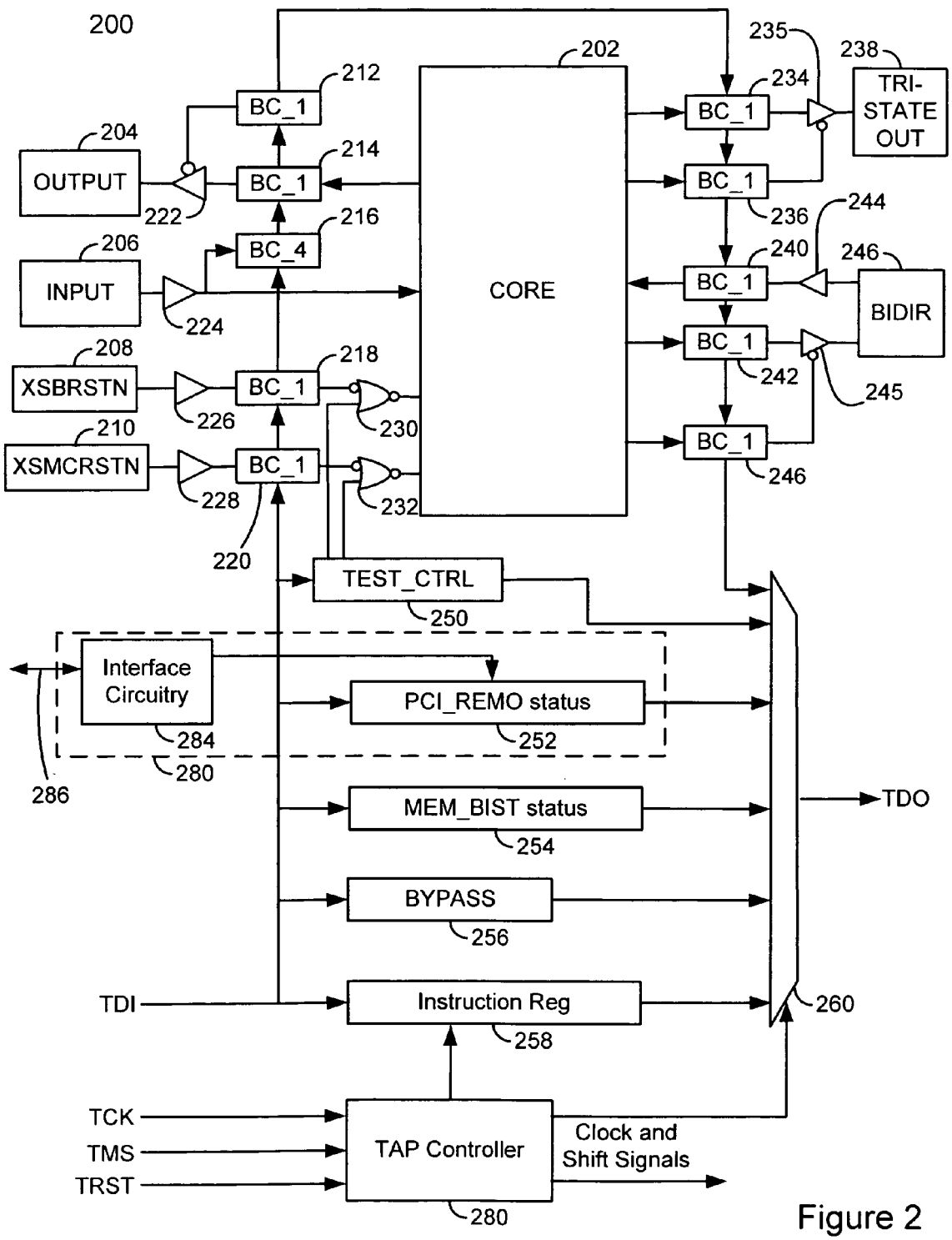
FIG. 2 illustrates one embodiment of test circuitry.

FIG. 2 illustrates one embodiment of system circuitry 200 for use with the present invention. In one embodiment, system circuitry 200 can be implemented within Southbridge processor 106 and Northbridge processor 104 of FIG. 1. System circuitry 200 includes core circuitry 202, a plurality of interconnected boundary scan cells (BSCs) forming a chain around core 202, a plurality of test data registers, instruction register 258, test access port (TAP) controller 280, output module 204, input module 206, reset inputs 208 and 210, and state detection circuitry 280. The BSCs include a first type of BSC (BC_1) and a second type of BSC (BC_4). In one embodiment, a BC_1 BSC is configured to perform a data load and unload in parallel while a BC_4 BSC is not. BC_1 BSCs include boundary scan cell 212, 214, 218, 220, 234, 236, 240, 242 and 246. BSC 216 is a type BC_4 BSC. The test data registers include public test data registers and private test data registers. The public test data registers include test control register 250 and bypass register 256. The private test data registers include PCI remote status register 252 (pci_remo) and memory built-in self-test status register 254 (mem_bist). The test data registers and instruction registers are connected to mux 260 which is driven by TAP controller 280. Interface circuitry 284 is connected between PCI remote status register 252 and a high speed serial interface 286. In one embodiment, high speed serial interface 286 is BSB 105 of FIG. 1. State detection circuitry 280 includes PCI remote status register 252 and interface circuitry 284 and is discussed in more detail below with respect to FIG. 9.

The chain of interconnected boundary scan cells 212 through 246 allow data to be passed along the BSC chain as well as to and from core 202. Test data lines are used to load and retrieve data along the chain. A test data input line (TDI) drives the first BSC 220. The last BSC 246 drives test data output (TDO). Data can be shifted from one BSC to another as discussed in more detail below. The TDI and TDO signals also load and receive information from test data registers 250–256 and instruction register 258. This is discussed in more detail below.

BSCs 220, 218, 216, 214, 234, 236, 240, 242 and 246 are connected in series to form the BSC chain. BSC 214 provides a signal to buffer 222 which provides an input to output 204. Buffer 222 is inversely enabled by boundary scan cell 212. Input 206 provides an input signal to buffer 224 which provides the signal to core 202 and BSC 216. Reset 208 provides a signal to buffer 226 which provides the signal to BSC 218. Reset input 210 provides a signal to buffer 228 which provides a signal to BSC 220. AND gate 230 receives a signal inverted from BSC 218 and a signal from test control data register 250. The inverted output of AND gate 230 is received by core 202. AND gate 232 receives an inverted output from BSC 220 and an output of test control data register 250. Core 202 receives an inverted output from AND gate 232. Tri-state output module 238 receives a signal from buffer 235. Buffer 235 receives an output signal from BSC 234 and is enabled by an inversed signal from BSC 236. Bidirectional module 246 provides a signal to buffer 244 and receives input from buffer 245. Buffer 244 provides input to BSC 240. Buffer 245 receives a signal from BSC 242 and is enabled by the inverse of a signal provided by BSC 246.

Instruction register 258 and test data registers 250–256 receive clock and shift signals generated by TAP controller 280 (not illustrated). Test data registers 250–256, instruction register 258 and TAP controller 280 are all described in more detail below.

TAP controller 290 receives a test clock (TCK) signal, a test mode select signal (TMS), and a test reset signal (TRST). TAP controller 280 provides enable, shift, clock and other signals to BSCs 212–246, test data registers 250–256, and instruction register 258 (not illustrated). TAP controller 280 also provides a select signal to mux 260. The signals provided by TAP controller 280 are used to operate the various BSCs, test data registers, and instruction register and transition between operational states of the test circuitry.

Figure 3:
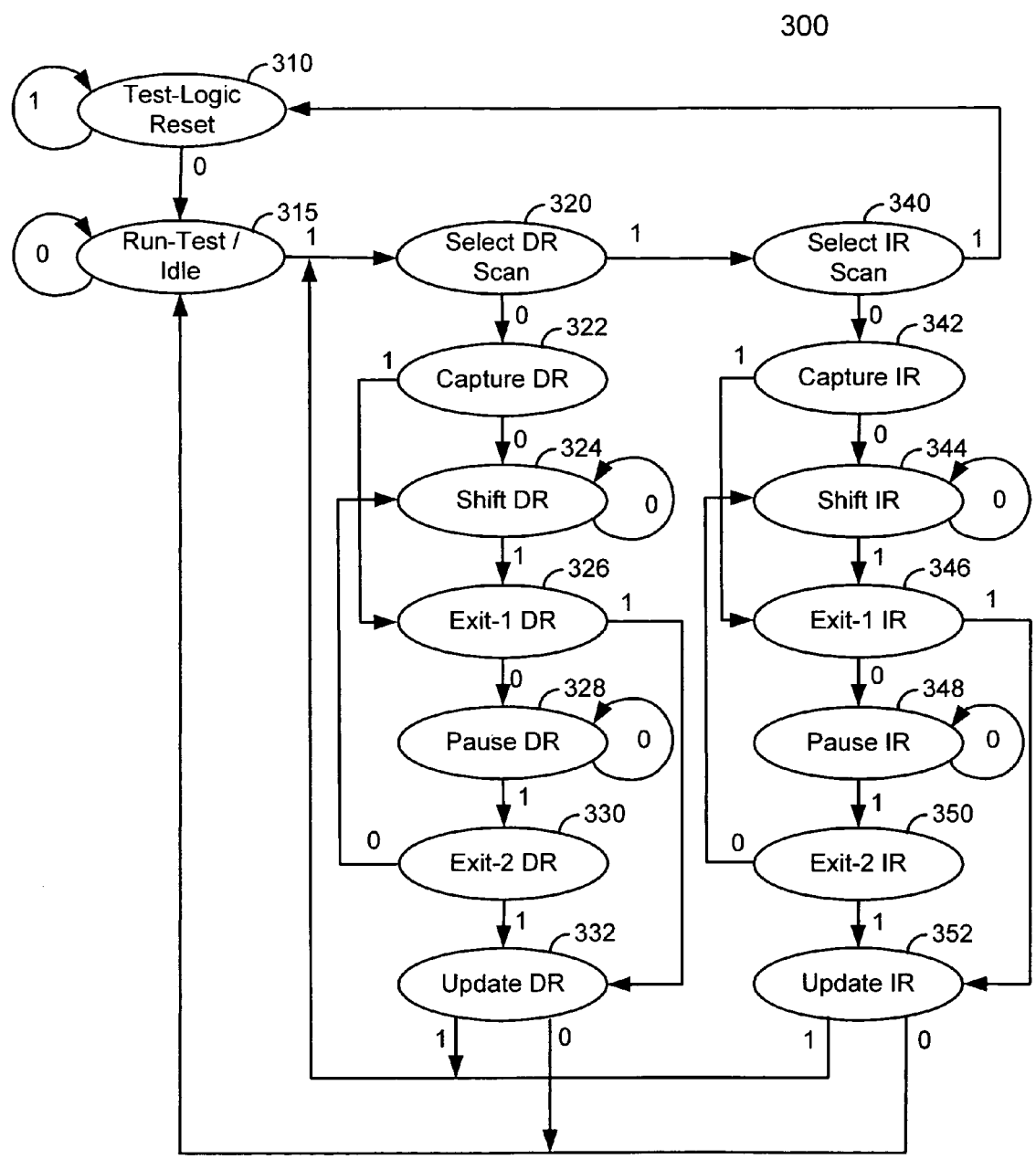
FIG. 3 illustrates one embodiment of a state diagram for a TAP controller.

FIG. 3 illustrates one embodiment of a state diagram 300 for TAP controller 280 of FIG. 2. State diagram 300 includes test logic reset state 310, run test idle state 315, data register states 320–332 and instruction register states 340–352. In one embodiment, transition between states in state diagram 300 is achieved by asserting a TMS signal received by the TAP controller to be high (illustrated by a "1" in FIG. 3) or low (a "0" in FIG. 3) at a rising edge of the TCK signal.

The initial state of TAP controller state diagram 300 is test logic reset stage 310. This initial state occurs as long as TMS is asserted high. Test logic reset state 310 disables the test logic so that normal operation of the on ship system logic can continue unhindered. In one embodiment, when the TAP controller is reset, the state of the TAP controller is automatically set to the test logic reset. TAP controller reset can be implemented by setting the test mode select signal high for five rising edges of test clock signal. Upon asserting TMS low, run test idle state 315 is asserted. The run test idle state is a controller state between scan operations. Once entered, the TAP controller will remain in the run test idle state as long as TMS is held low. The TAP controller remains at this idle state until TMS is asserted high. Upon asserting TMS high, the select DR scan state 320 is asserted. This state is a temporary controller state in which all test data registers selected by the current instruction retain their previous state.

From select DR scan state 320, asserting TMS low causes a transition to capture DR state 322. In one embodiment, the data "captured" is the result of a test If from the select DR scan state 320 TMS is asserted high, then select IR scan state 340 is entered. The select IR scan state is a temporary controller state in which all test data registers selected by the current instruction retain their previous state. Similar to the select DR state, this state allows for a sequence of IR states to be selected.

The capture DR state is a controller state in which data may be parallel loaded into test data registers selected by the current instruction on the rising edge of the TCK signal. If a test data register selected by the current instruction does not have a parallel input where capturing is not required for the selected test, the register retains its previous state unchanged. At capture DR state 322, asserting TMS high will cause a transition to exit DR state 326. A TMS asserted low at the capture DR state will cause a transition to a shift DR state 324. The shift DR state provides for the test data register currently connected between the TDI and TDO signals as a result of the current instruction to shift data one stage towards its serial output on each rising edge of TCK. Test data registers that are selected by the current instruction, but are not placed in a serial path, retain their previous state unchanged.

Operation remains in the shift DR state 324 as long as TMS remains low. Once the TMS signal is asserted high, operation continues to exit DR state 326. Asserting TMS high while at the exit DR state 326 causes a transition to update DR state 332. At update DR 332, the system updates an enabled data register. This may include retrieving information from circuitry connected to the enabled data register. If TMS is asserted low, operation continues to the pause DR state 328. Operation remains at the pause DR state until TMS is asserted high.

The pause DR state allows shifting of the test data register in the serial path between TDI and TDO to be temporarily halted. All test data registers selected by the current instruction retain their previous state unchanged. In some embodiments, test data registers are provided with latched parallel output to prevent changes at the parallel output while data is shifted in the associated shift register path and responds to certain instructions. Data is latched onto parallel output of these test data registers from the shift register path on the following edge of TCK and the update DR controller state.

The pause DR state may be used to implement delays in test circuit processing. Once TMS is asserted high while at pause DR state 328, the exit DR state 330 is asserted. From exit DR state 330, the state diagram transitions to update DR state 332 when TMS is asserted high. If TMS is asserted low, the state diagram transitions from exit DR state 330 to shift DR state 324. Once in the update DR state 332, if TMS is asserted low, operation returns to run test idle state 315. IF TMS is asserted high, operation returns to a select DR scan state 320.

Returning to select DR state 320, a transition to select IR state occurs when TMS is asserted high. At select IR scan state 340, the state diagram transitions to capture IR state 342 upon TMS asserted low. If TMS is asserted high, test logic reset state 310 is asserted.

Operation of instruction register states 340–352 is similar to that of data register states 320–332 discussed above. The capture IR state allows the shift register contained in the instruction register to load a pattern of fixed logic values on the rising edge of TCK. The shift IR state allows for shift registers contained in the instruction register connected between the TDI and TDO to shift data one stage towards its serial output on each rising edge of TCK. The update IR instruction allows for the instruction shifted into the instruction register to be latched onto the parallel output from the shift register path on the following edge of TCK. Use of the TAP controller state with respect to the current invention is discussed in more detail below with respect to FIG. 14.

Figure 4:
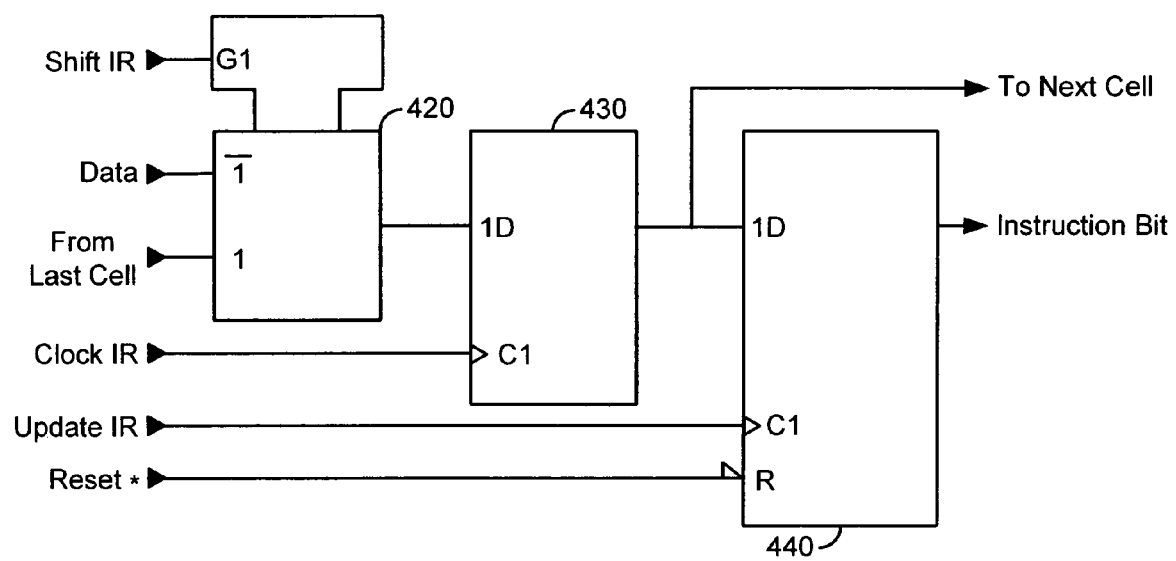
FIG. 4 illustrates one embodiment of an instruction register cell.

FIG. 4 illustrates one embodiment of an instruction register cell 400 used to implement instruction register 258 of FIG. 2. Instruction register cell 400 includes mux device 420, flip flop 430 and flip flop 440. Mux 220 receives a data signal and last cell signal inputs and a shift IR selection input. The shift IR signal selects either the data signal or last cell signal to output or "shift" to flip flop 430. Flip flop 430 receives the output signal from mux 420 and an IR clock. Flip flop 430 is driven by the IR clock to output the signal received from mux 420. In operation, flip flop 430 will latch a voltage level detected at the flip flop input to the flip flop output upon detecting a the rising edge of a driving signal (here, a clock signal). Flip flop 440 is driven by an update IR signal to provide an output that mirrors the flip flop 430 output. The output of flip flop 430 is provided to the next instruction register cell as well as the input of flip flop 440. In one embodiment, flip flop 440 outputs an instruction bit that can be utilized as parallel output. Flip flop 440 also receives an inverted reset signal. An instruction register, such as instruction register 258 of FIG. 2, may be comprised of several interconnected instruction register cells 400. In this case, the output of flip flop 430 in one instruction cell is connected to the "last cell input" of mux 420 of the next instruction register cell.

Figure 5:
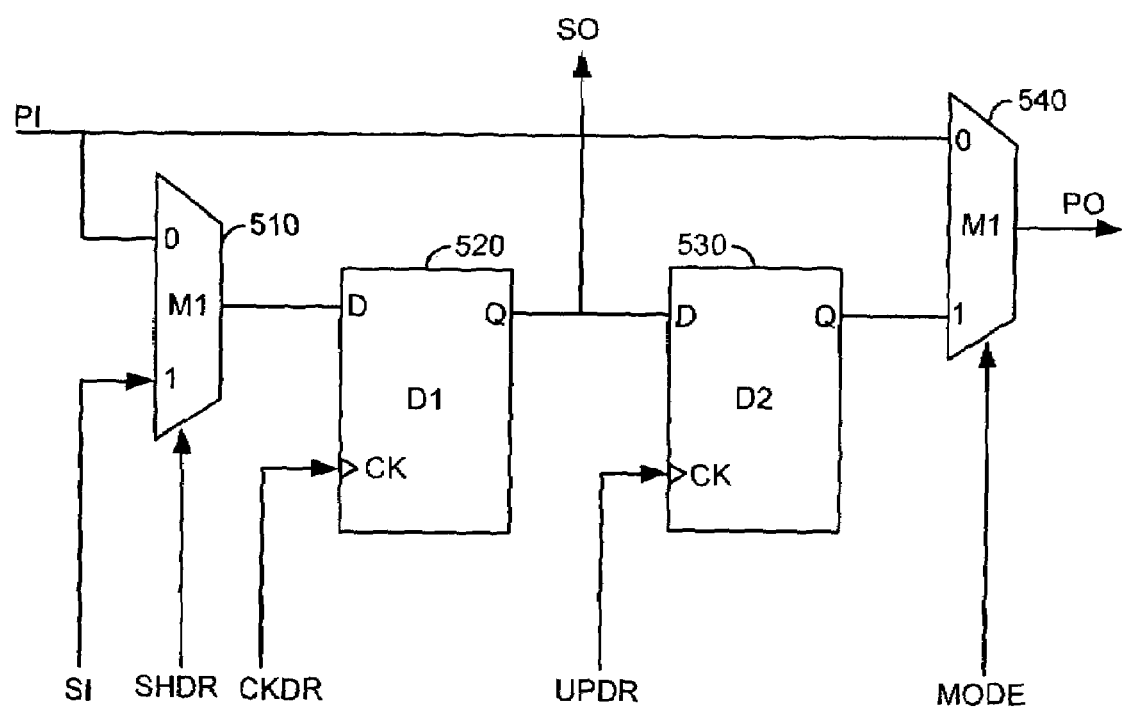
FIG. 5 illustrates one embodiment of a boundary scan cell.

FIG. 5 illustrates one embodiment of a BC_1 type BSC of FIG. 2 in more detail. BSC 500 of FIG. 5 includes a mux device 510, a flip flop device 520, a second flip flop device 530 and a second mux 540. The mux receives a parallel input signal PI as well as a scan path input signal SI. The mux is driven by a shift data register signal SHDR. In one embodiment, during a scan mode, SHDR is asserted high to enable mux 510 to output SI. The output of the mux is connected to the input of flip flop 520. Flip flop 520 is driven by a data register clock signal CKDR. The output of flip flop 520 provides the output of mux 510 and scan path output signal SO. Flip flop 530 receives the output of flip flop 520 and is driven by an update data register UPDR signal to provide an output to mux 540. Mux 540 receives the output of flip flop 530 and the PI signal. A MODE signal selects which input of the mux to provide as the parallel output (PO) signal.

In operation, a series of BSCs can be interconnected as a chain of cells. Each BC_1 receives both a SI and PI input. The SHDR signal determines which of these two signals is to be latched out to the next cell at SO. Additionally, the selected signal can be latched to a PO output using flip flop 530 and mux 540. In FIG. 2, the SI and SO signals are used to interconnect the BSCs while the PI and PO signals are used to interconnect the core and buffer signals.

Figure 6:
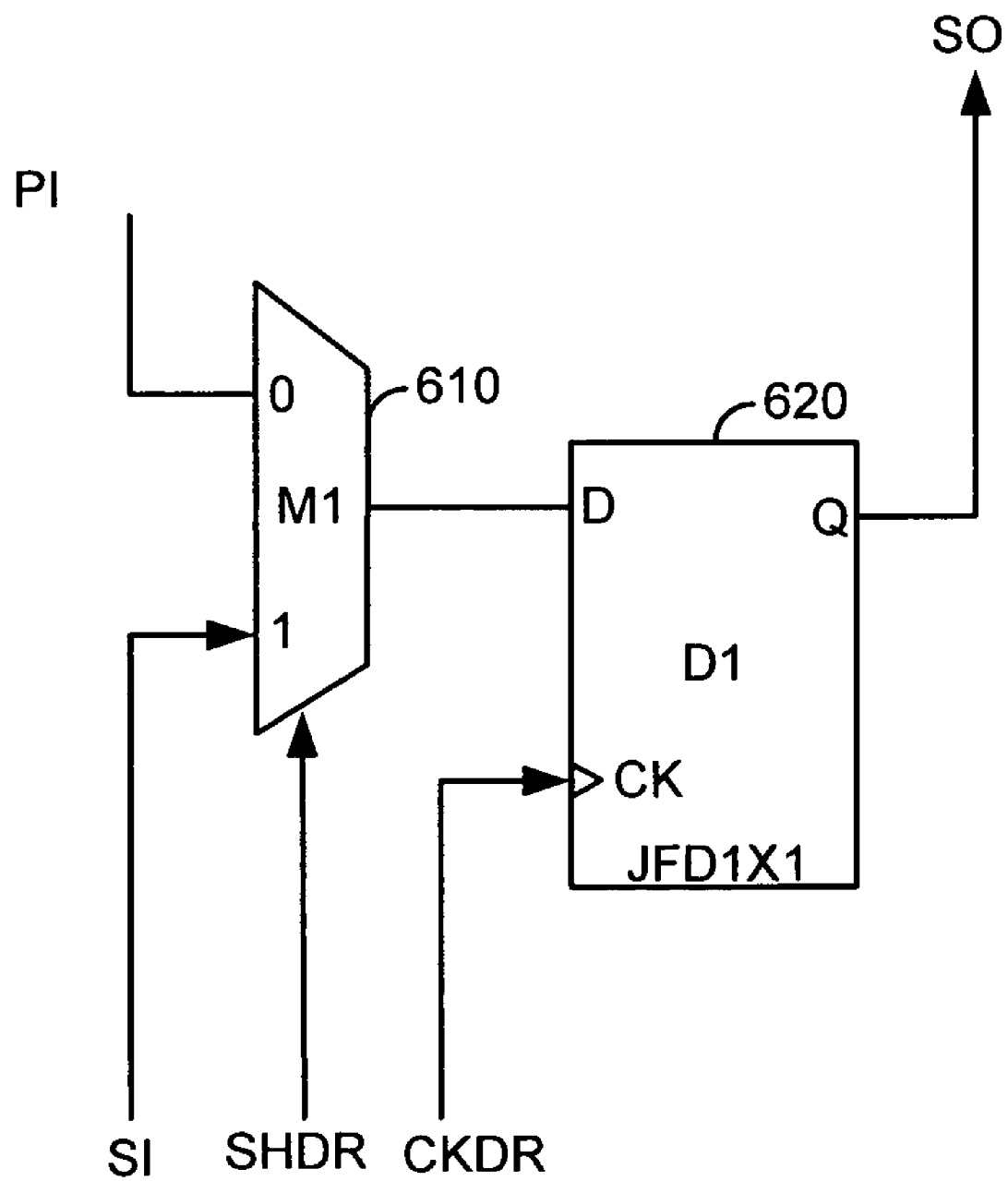
FIG. 6 illustrates another embodiment of a boundary scan cell.

FIG. 6 illustrates one embodiment of a BC_4 BSC of FIG. 2 in more detail. BSC 600 of FIG. 6 includes a mux device 610 and a flip flop device 620. Mux 610 receives a parallel input signal PI and a scan input signal SI. A mux output is selected by a shift data register signal SHDR. Flip flop 620 receives the output of mux 510 and is driven by data register clock CKDR. The output of flip flop 620 is a scan path output signal SO. Similar to the BSC of FIG. 5, BSC 600 can be used to implement one or more BSCs of a BSC chain. In this case, the scan input of the first BSC is driven by the TDI signal. The scan output signal of the last BSC in the chain drives the TDO output. For the BSCs in between, the output of the flip flop of the BSC provides the scan input of the next cell. As mentioned above, BSC BC_4 does not provide for parallel loading of data out of the BSC.

FIG. 7 illustrates a table 700 illustrating one embodiment of opcodes associated with instructions received by instruction register 258 of FIG. 2. Table 700 includes opcodes for public instructions and private instructions. The public instructions include a sample/preload instruction and a bypass instruction. The private instructions include mem_bist, pcie_bist, pcie_remo, and test_ctrl. The opcodes associated with these instructions are only an example of possible opcodes. Other opcodes can be used as needed within a particular system. FIG. 8 includes a table 800 illustrating one embodiment of test data register information. As illustrated, the test data registers include boundary scan registers and the pcie_remo data register. The information includes the register size, instruction and required clock frequency for operation of each register. IN one embodiment, a PCI_REMO register used to retrieve PCI Express state information is comprised of two BSC cells and driven by a 100 MHz clock.

Figure 9:
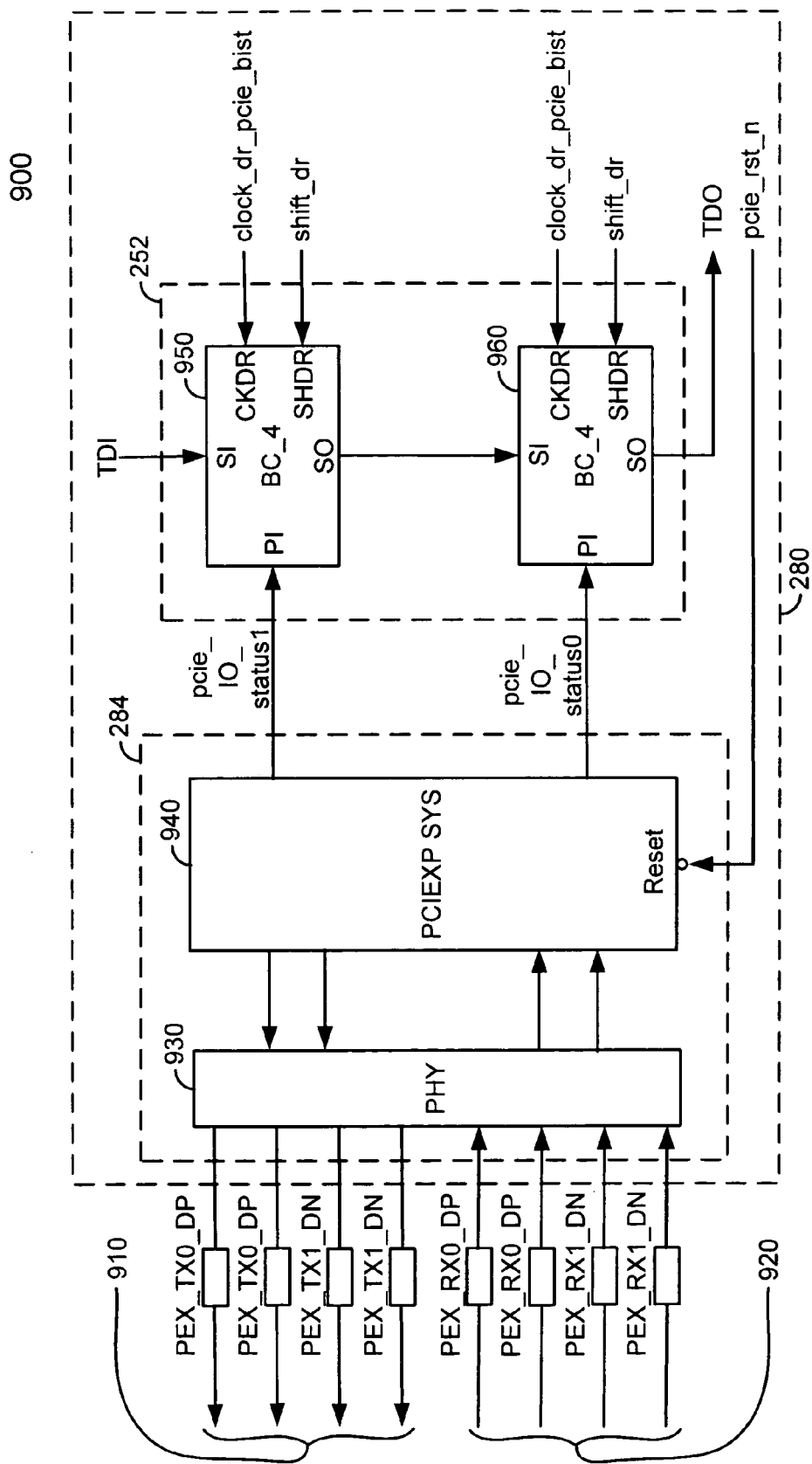
FIG. 9 illustrates one embodiment of test circuitry and interface circuitry.

FIG. 9 illustrates one embodiment of state detection circuitry 280 including test circuitry 252 interconnected with interface circuitry 284. Transmit lines 910 and receiving lines 920 are connected to interface circuitry 284. Interface circuitry 284 includes physical interface layer 930 and PCI express system circuitry 940. Test circuitry 252 includes PCI_REMO test data register comprised of BSC 950 and 960. In the embodiment illustrated, BSC 950 and BSC 960 are BC_4 type BSCs. Transmit lines 910 include two differential pairs of transmission lines. Receiving lines 920 include two differential pairs of receiving lines. In one embodiment, transmit lines 910 and receiving lines 920 implement high speed serial interface 286 of FIG. 2. Both the receiving lines and transmit lines are connected to the physical interface layer 930 of test circuitry 950. The PCI express system circuitry 940 is connected to the physical interface layer 930 and receives a reset signal pcie_rstn from core circuitry 202 of FIG. 2.

In one embodiment, the PCI express system circuitry includes the logic and components required to initialize, configure and maintain the PCI express interface. In one embodiment, the initialization and configuration logic and components include Link Training logic and components. Link Training logic and components are discussed in more detail below.

Test data register 252 of FIG. 9 receives status signals from the PCI express system circuitry 940. As illustrated, one status signal is received by each BSC of test data register 252. The pci_io_status0 and pci_io_status1 status bits are generated by the interface circuitry independently from test circuitry operation and stored internally by interface circuitry. The status bits are not sent or received through pins of the IC containing interface circuitry 284. Once received, the data bits are shifted out towards TDO using the clock and shift DR signals received by both BCSs. Operation of the components of FIG. 9 are discussed with reference to FIGS. 10–14.

Figure 10:
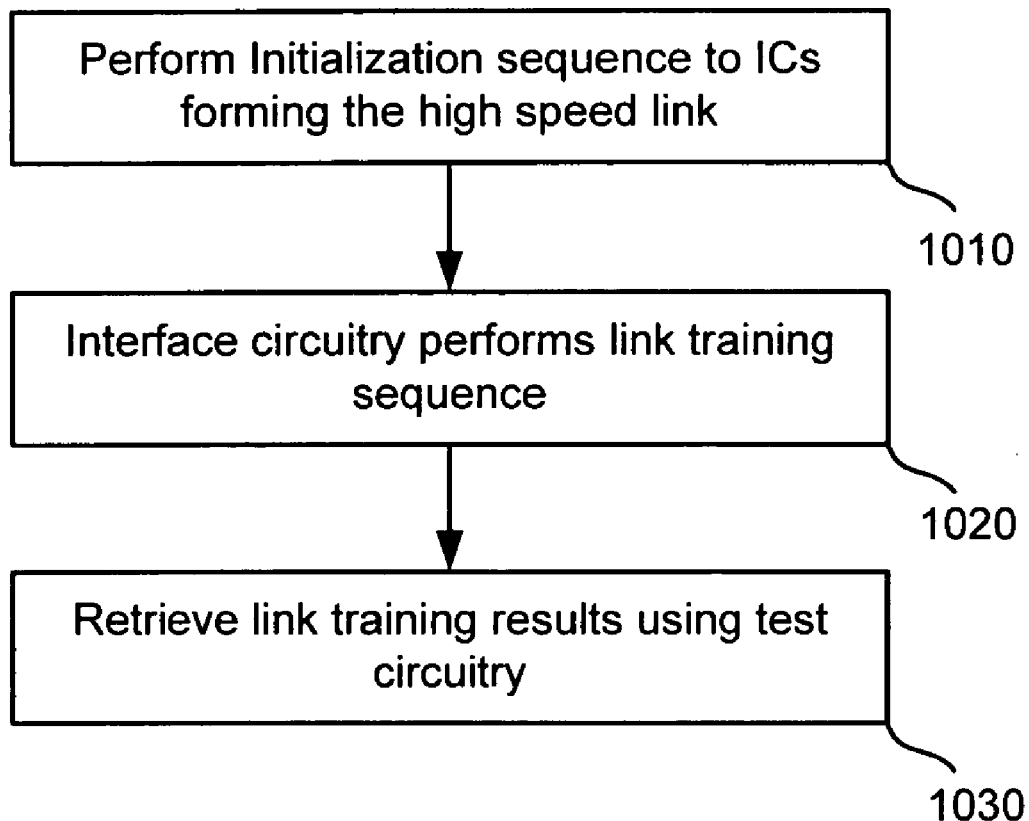
FIG. 10 illustrates one embodiment of a method for retrieving the connectivity state of a high speed serial interface.
Figure 11:
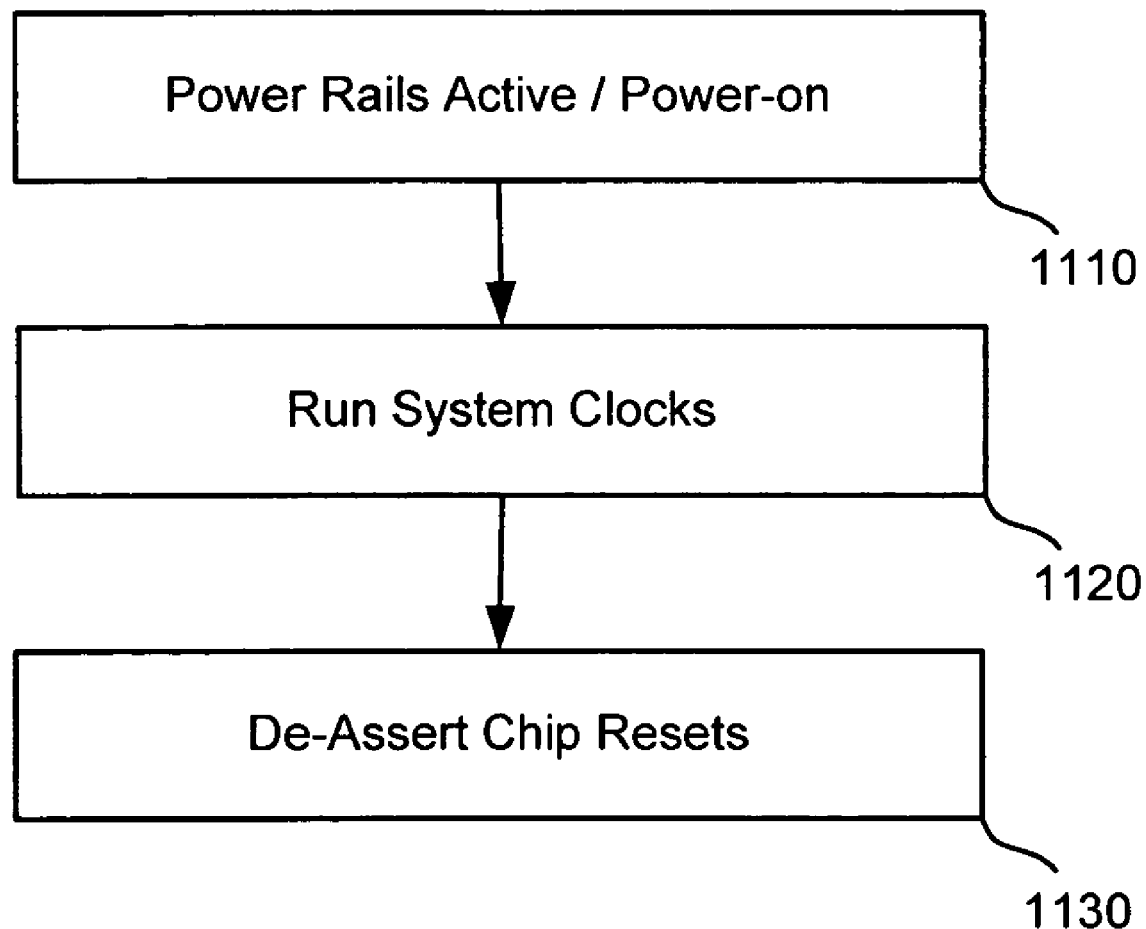
FIG. 11 illustrates one embodiment of a method for initializing a circuit.

FIG. 10 illustrates one embodiment of a method for retrieving the connectivity state of the PCI express interface. Method 1000 begins by performing an initialization sequence on the ICs comprising the link at step 1010. This is discussed in more detail below in FIG. 11. Interface circuitry within each IC then performs Link Training at step 1020. This is discussed below with respect to FIGS. 12–13. Results of the Link Training are retrieved at step 1030. This is discussed in more detail in FIG. 14.

Figure 12:
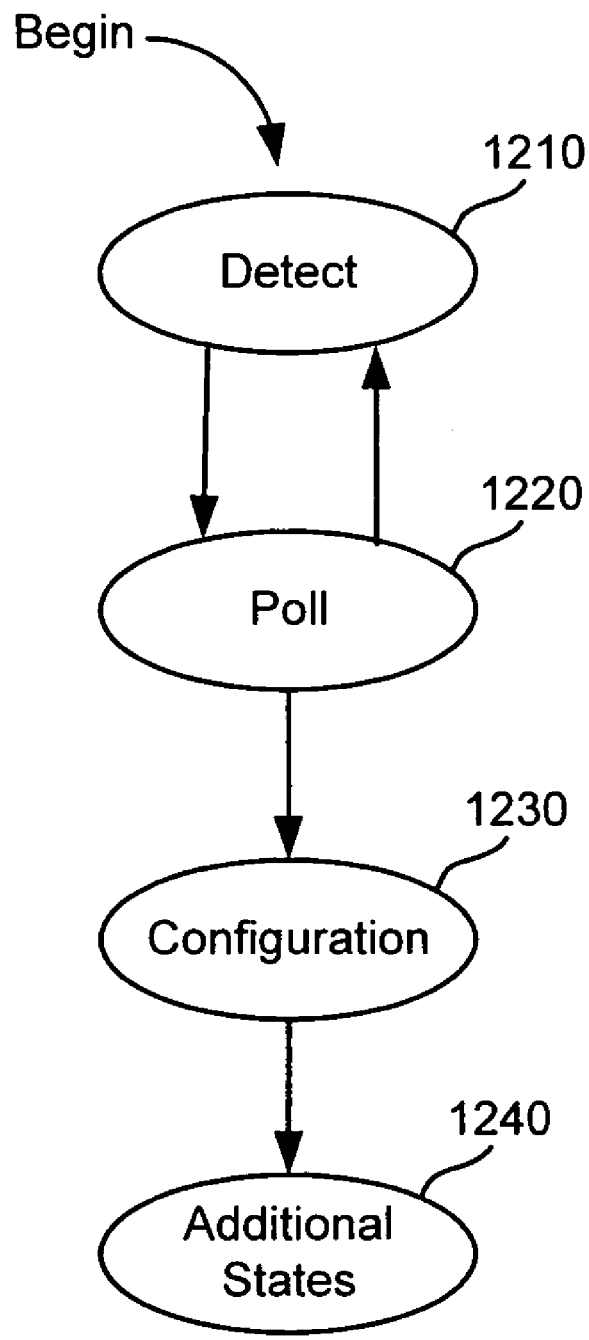
FIG. 12 illustrates one embodiment of a link training state diagram.

Method 1100 of FIG. 11 illustrates one embodiment for performing an initialization sequence to ICs connected by a high speed interface as discussed above in step 1010 of FIG. 11. Method 1100 begins with applying power to the rails of the Southbridge and Northbridge processors of FIG. 1 at step 1110. System clocks are then run at step 1120. The system clocks of the ICs are run by setting the appropriate inputs to Southbridge processor 106 and Northbridge processor 104. After the system clocks are running, chip resets are de-asserted at step 1130. The chip resets include resets 208 and 210 of FIG. 2, as well as resets for Southbridge processor 106 and Northbridge processor 104 (not illustrated). In one embodiment, applying power, running system clocks and de-asserting chip resets brings an IC to a limited active state and does not enable an IC to achieve full functionality or require full power. This can be advantageous because it allows the IC connectivity to be determined while minimizing the power requirement After the chip resets are de-asserted, the Link Training sequence will begin. The Link Training process involves transitioning between a number of states reflecting the connectivity of the interface. In one embodiment, the Link Training sequence is a standard sequence associated with the PCI express interface. FIG. 12 illustrates a state diagram of the Link Training sequence. State diagram 1200 begins at initial detect state 1210. At state 1210, the interface circuitry determines whether the interface is connected to another integrated circuit utilizing the interface. If connectivity is confirmed at state 1210, a poll state 1220 is asserted. At the poll state, the interface circuitry configures the size and other features of the interface. After polling, the interface is further configured at state 1230. Additional states are then asserted as indicated at state 1240.

Figure 13:
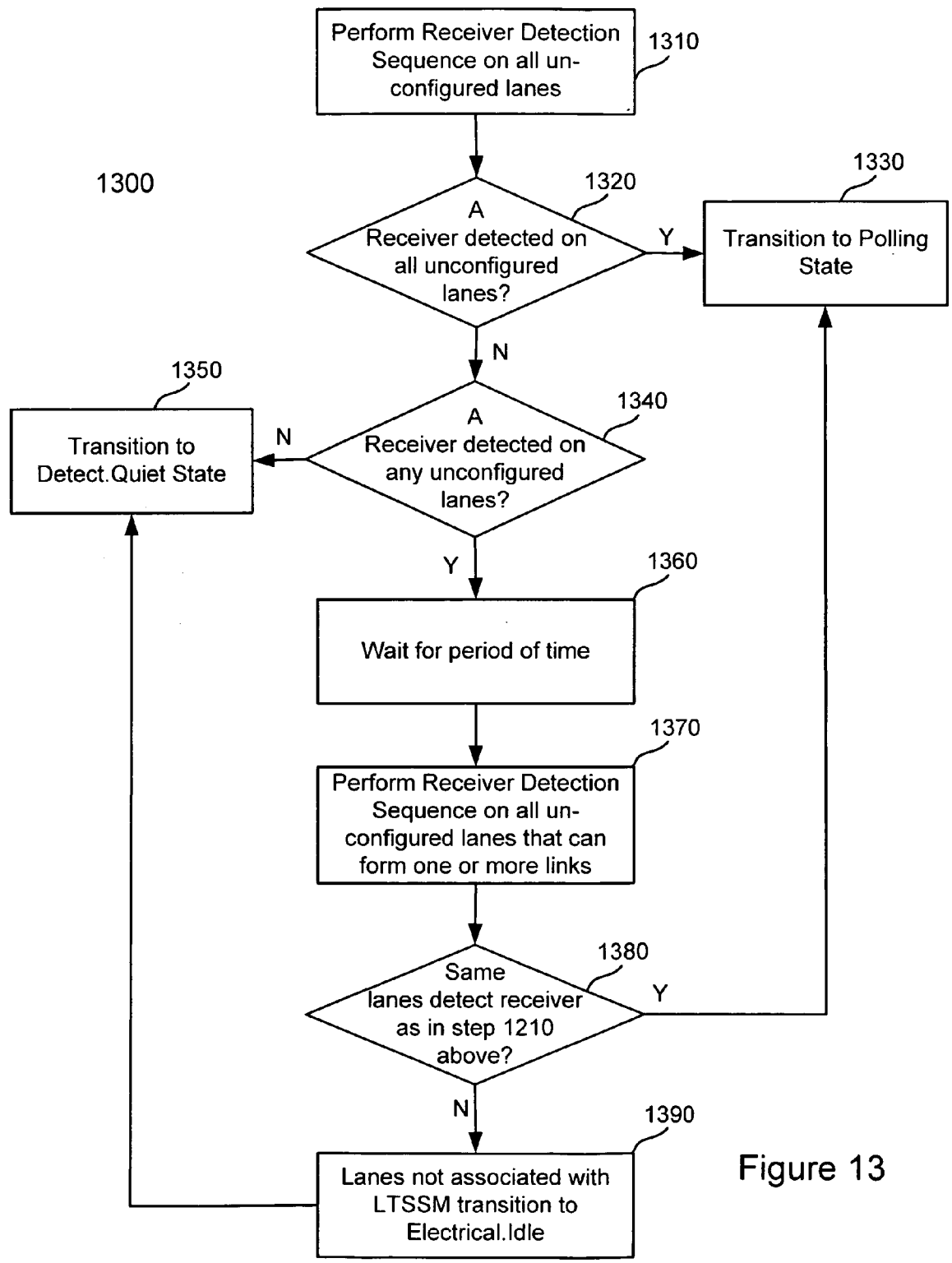
FIG. 13 illustrates one embodiment of a method for performing a link training sequence.

FIG. 13 illustrates one embodiment of a method 1300 for performing a Link Training sequence as discussed above at step 1020 of FIG. 1000. Method 1300 begins with performing a receiver detection sequence on all unconfigured lanes at step 1310. In one embodiment, a lane is a set of differential signal pairs. One pair is used for transmission and one pair is used for reception of signals by an IC. A link is a connection between two ports and the interconnecting lanes. Unconfigured lanes are not currently associated with a link. Thus, at step 1310, the interface circuitry determines whether the differential pairs are able to send and receive a signal with respect to a neighboring processor or IC. With respect to FIG. 1, the receiver detection sequence is performed by Southbridge processor 104 through backside bus 105 to determine whether the connection with Northbridge processor 106 is made. At step 1320, the interface circuitry determines whether a receiver is detected on all unconfigured lanes. If a receiver, such as the Northbridge processor, is detected on all unconfigured lanes, operation continues to step 1330 where the circuitry transitions to a polling state as illustrated in FIG. 12. If a receiver is not detected on all unconfigured lanes, operation continues to step 1340.

Interface circuitry determines whether a receiver is detected on any unconfigured lanes at step 1340. If no receiver is detected on any unconfigured lanes, the interface circuitry transitions to a quiet state at step 1350. A quiet state indicates that the ICs failed to make a connection. If a receiver is detected on any unconfigured lane at step 1340, the interface circuitry will wait for a period of time at 1370. In one embodiment, the period of time is approximately 12 milliseconds. The interface circuitry then performs a second receiver detection sequence on all unconfigured lanes that conform to one or more links at step 1370. In one embodiment, the unconfigured lanes that conform one or more links are the lanes detected as a result of the receiver detection sequence performed at step 1310. The interface circuitry then determines whether the same lanes detect a receiver as in step 1310 above. If the same lanes detect a receiver, then the interface circuitry transitions to the polling state at step 1330. If the same lanes do not detect a receiver, then the lanes not associated with a Link Training status state machine transition to the electric idle state. Operation then continues to step 1350 where the interface circuitry state is set to the detect quiet state.

Figure 14:
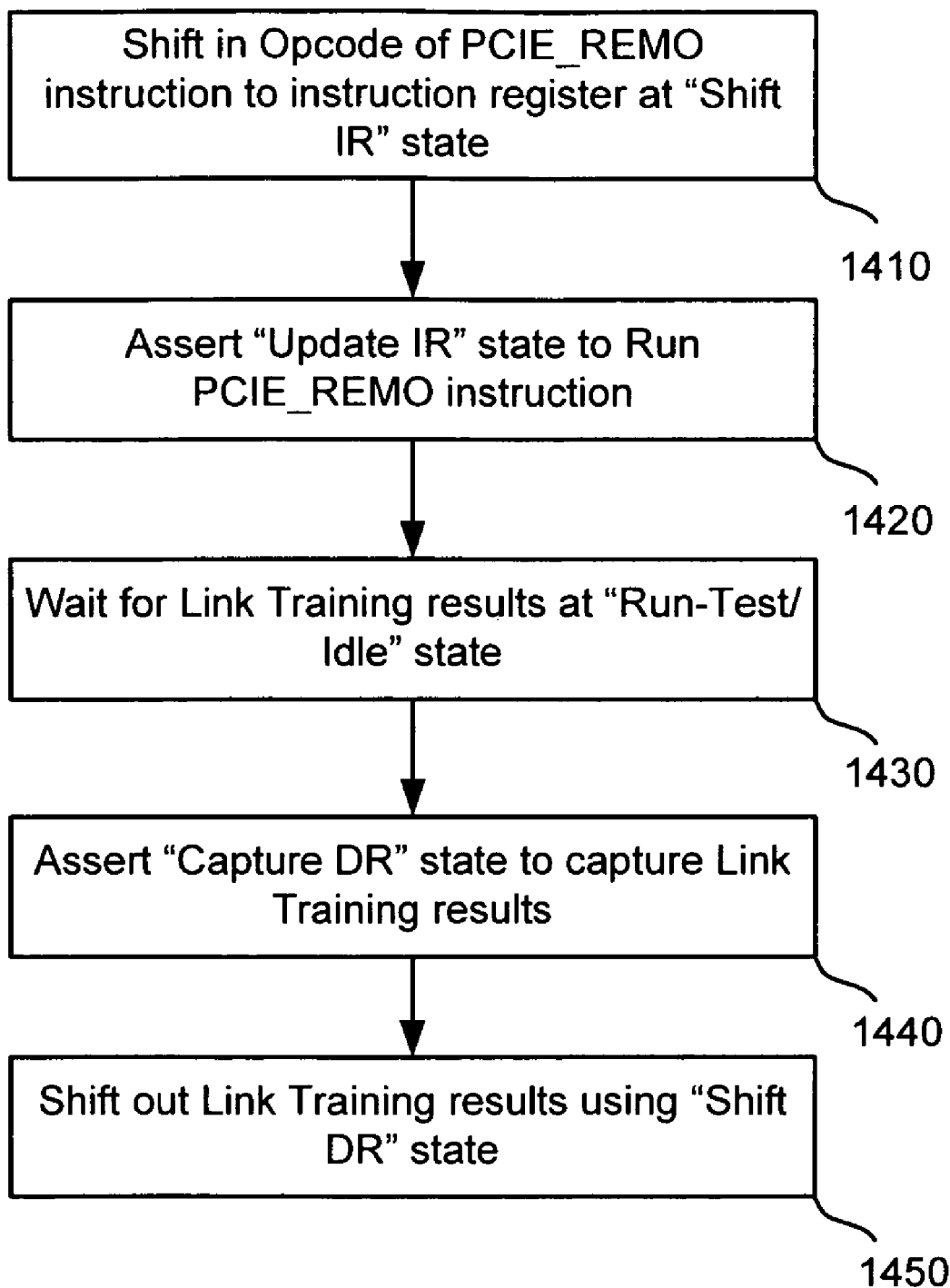
FIG. 14 illustrates one embodiment of a method for retrieving link training results.

The Link Training process results are retrieved using test circuitry. FIG. 14 illustrates one embodiment of a method 1400 for retrieving Link Training results as discussed above in step 1030 of FIG. 10. In one embodiment, the steps of method 1400 involve transitioning between states of the TAP controller to control operation of instruction register 258 and pcie_remo data register 252 of FIG. 2.

Method 1400 begins when the opcode of the pcie_remo instruction is shifted into the instruction register at the shift IR state of the TAP controller at step 1410. The shift IR state of Tap Controller 280 can be asserted as discussed above utilizing states 340–344 of the TAP Controller state diagram 300 of FIG. 3. In one embodiment, the opcode associated with the PCI_REMO instruction illustrated in table 700 of FIG. 7 is shifted into instruction register 258. Next, the update IR state is used to run the pcie_remo instruction at step 1420. This step is performed at state 344–352 of the state diagram as discussed above. After the instruction is run, the system will wait for the Link Training results while residing at the run test idle state at step 1430. In one embodiment, the system will wait for a period of time (for example, 30 ms) after which the Link Training results should be available. The system then asserts a capture DR state to capture the Link Training results at step 1440. This is performed at state 322 within TAP Controller state diagram 300. As discussed above, capturing the results includes loading valves applied to the pcie_IO_status0 and pcie_IO_status0 lines of FIG. 1 onto the BCS parallel input PO lines of BSC 950 and BSC 960 of the PCI_REMO test data register. Once the Link Training results are captured, the Link Training results are shifted out of the data registers using the shift DR state 324 of the state diagram at step 1450. In one embodiment, the results are shifted out through the scan path input and output chain onto TDO.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

We claim:

1. A method for determining the state of a high speed interface, comprising:
   performing an automated connectivity test for a high-speed interface using interface circuitry during initialization of the high-speed interface, the automated connectivity test determines the state of one or more differential pairs of communication lines;
   storing connectivity test results on the interface circuitry; and
   retrieving the connectivity test results from the interface circuitry using test circuitry.

2. The method of claim 1, wherein said step of performing a connectivity test includes detecting a connection between the high-speed interface and a second high-speed interface.

3. The method of claim 2, wherein said step of performing a connectivity test includes asserting a connection state in response to detecting the connection.

4. The method of claim 1, wherein said step of performing an automated connectivity test includes determining the state of a connection between the interface circuitry on a first integrated circuit and a second interface circuitry on a second integrated circuit.

5. The method of claim 1, wherein retrieving the connectivity test results includes:
   loading an instruction into an instruction register; and
   retrieving the connectivity test results in response to loading the instruction.

6. The method of claim 1, wherein retrieving the connectivity test results includes:
   enabling one or more data registers connectively coupled to the interface circuitry; and
   receiving the connectivity test results into the one or more data registers.

7. The method of claim 6, wherein the one or more data registers are enabled by loading an instruction into an instruction register.

8. The method of claim 6, wherein retrieving the connectivity test results includes:
   initiating a test results capture sequence independent of the connectivity test; and
   retrieving connectivity test results upon detection of storage of the connectivity test results in the interface circuitry.

* * * * *